(12) United States Patent
Imai

(10) Patent No.: US 6,881,998 B2
(45) Date of Patent: Apr. 19, 2005

(54) SEMICONDUCTOR DEVICE AND METHOD FOR PRODUCING THE SAME

(75) Inventor: Shinichi Imai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/960,575

(22) Filed: Sep. 24, 2001

(65) Prior Publication Data

US 2002/0058390 A1 May 16, 2002

(30) Foreign Application Priority Data

Sep. 25, 2000 (JP) ........................................ 2000-290119

(51) Int. Cl.[7] ............................................ H01L 27/108
(52) U.S. Cl. ...................... 257/306; 257/393; 257/396; 257/303; 257/552; 257/539
(58) Field of Search ................................. 257/306, 393, 257/396, 303, 552, 539; 438/205, 393

(56) References Cited

U.S. PATENT DOCUMENTS 5,691,556 A * 11/1997 Saito et al. ................. 257/350

6,084,271 A * 7/2000 Yu et al. ..................... 257/351

* cited by examiner

*Primary Examiner*—Eddie Lee
*Assistant Examiner*—Thomas Magee
(74) *Attorney, Agent, or Firm*—Nixon Peabody LLP; Donald R. Studebaker

(57) ABSTRACT

A semiconductor device of the present invention includes a semiconductor substrate including an active region and an isolating region provided so as to enclose the active region; a capacitance insulating film that is provided on the active region and has a boundary portion in contact with the isolating region; an upper electrode provided on the capacitance insulating film so as to be spaced away from the isolating region; an electrode pad provided on the isolating region; a lead conductive film provided over a part of the capacitance insulating film and a part of the isolating region for connecting the upper electrode and the electrode pad; and an interlayer insulating film provided over the substrate. Connection holes penetrating the interlayer insulating film to reach the electrode pad are formed, and the ratio of the total sum of the exposed areas of the electrode pad in the contact holes with respect to the total sum of the widths of the lead conductive films in the boundary portion is a certain value or less.

3 Claims, 8 Drawing Sheets

SEMICONDUCTOR DEVICE AND METHOD FOR PRODUCING THE SAME

BACKGROUND OF THE INVENTION

The present invention relates to semiconductor devices that are MIS capacitors and methods for producing the same, in particular, semiconductor devices that are MIS capacitors that can be produced in a high yield.

Conventionally, as shown in FIGS. 6(a) and 6(b), a semiconductor device 100 that is a MOS capacitor includes an isolating region 114 on a silicon substrate 112, and an active region 116 is formed in an upper portion of the silicon substrate 112 enclosed by the isolating region 114. A capacitance insulating film 118 is formed on the active region 116. A rectangular upper electrode 121 is provided on the capacitance insulating film 118 so as to be spaced away from the isolating region 114. On the separating portion 114, a rectangular ring electrode pad 124 is provided so as to enclose the active region 116. Each side of the electrode pad 124 and each side of the upper electrode 121 are connected to each other via a lead conductive film 122. An interlayer insulating film 126 is formed above the substrate, and multiple contact holes 128 (a diameter of 0.28 $\mu$m) penetrating the interlayer insulating film 126 to reach the electrode pad 124 are opened. Plugs obtained by filling a conductive film are formed in the contact holes 128, and the electric potential of the upper electrode is controlled via these plugs.

However, the semiconductor device 100 that is a conventional MOS capacitor has the problem that the breakdown of the capacitance insulating film 118 occurs when plasma etching is performed with respect to the interlayer insulating film 126 to form the contact holes. When the portion of the capacitance insulating film 118 in which breakdown had occurred was investigated by emission spectrometry, it was found that all the breakdown of the capacitance insulating film 118 occurred in a boundary portion Rcr that is in contact with the isolating region 114 below the lead conductive films 122. Then, the inventors of the present invention concluded with regard to the mechanism causing this problem as follows.

FIGS. 7(a) and 7(b) are views illustrating the mechanism that causes breakdown of the capacitance insulating film.

As shown in FIG. 7(a), the interlayer film 126 is etched primarily by positive ions extracted from a plasma, and when the contact hole 128 penetrates the interlayer film 126, the surface of the electrode pad 124 is exposed. At this time, the electrode pad 124, the upper electrode 121, and the lead conductive film 122 are positively charged with the incident positive ions. In general, the positive charges are electrically neutralized by the negative ions and electrons that are alternately incident to the contact holes by using a high frequency plasma. However, as shown in FIG. 7(b), the surface of the substrate is negatively charged with electrons. Therefore, when the contact hole 128 having a high aspect ratio is formed, the electrons become susceptible to the influence of the negatively charged surface of the substrate (surface of the resist film), so that the electrons become difficult to be incident to the contact hole 128.

Furthermore, the positive ions in plasma are incident to the substrate while being accelerated by an electric field in an ion sheath generated in the plasma. The generation of the ion sheath results from the difference in the mobility between positive ions and electrons, that is, the fact that positive ions are difficult to move because the mass of a positive ion is larger than that of an electron. As a result, a negative electric potential called "self bias" occurs on the surface of the substrate. The positive ions collide with the surface of the substrate while bearing an energy of the potential in the plasma and the self bias. On the other hand, the electrons are difficult to be incident into the contact hole because the ion sheath acts as a decelerating electric field.

As described above, when the positive charges are accumulated in the electrode pad 124, the upper electrode 121, and the lead conductive film 122, an electric filed should be concentrated in the boundary portion Rcr of the capacitance insulating film 118 that is in contact with the isolating regions 114 below the bent lead conductive film 122. Then, when a voltage exceeding the breakdown voltage of the capacitance insulating film 118 is applied between the upper surface and the lower surface of the boundary portion Rcr of the capacitance insulating film 118 that is in contact with the isolating region 114, the breakdown of the capacitance insulating film 118 occurs in the boundary portion Rcr. The capacitance insulating film 118 is formed by thermal oxidation or CVD after the isolating region 114 is formed. There are a large amount of impurities and defects in a portion of the isolating region 114 bordering the active region. Therefore, when the capacitance insulating film 118 is formed by thermal oxidation, the capacitance insulating film 118 in the boundary portion Rcr that is in contact with the isolating region 114 is thin, so that the breakdown voltage in the boundary portion Rcr of the capacitance insulating film 118 that is in contact with the isolating region 114 is reduced. Furthermore, when the capacitance insulating film 118 is formed by CVD, the film quality of the capacitance insulating film 118 in the boundary portion Rcr that is in contact with the isolating region 114 is deteriorated by impurities, so that the breakdown voltage in the boundary portion Rcr of the capacitance insulating film 118 that is in contact with the isolating region 114 is reduced. Thus, in either case, breakdown of the capacitance insulating film is likely to occur.

In order to solve the above-described problems, it is believed to be effective to adjust the antenna ratio to be a certain value or more. The antenna ratio refers to the ratio of the total sum (S) of the exposed areas of the electrode pad 124 in the contact holes 128 to the area of the upper electrode 121. The breakdown ratio of the capacitance insulating film of the semiconductor device 100 that is a MOS capacitor when changing the total sum (S) of the exposed areas of the electrode pads 124 in the contact holes 128 was measured. FIG. 8 shows the measurement results thereof.

FIG. 8 is a graph showing the dependence of the capacitance insulating film breakdown ratio on the ratio of the total sum (S) of the exposed areas of the electrode pad in the contact holes to the area of the upper electrode 121. In FIG. 8, the horizontal axis shows the ratio (antenna ratio) of the total sum (S) of the exposed areas of the electrode pad in the contact holes to the area of the upper electrode, and the vertical axis shows the capacitance insulating film breakdown ratio. These results indicate that when the antenna ratio is relatively small, the breakdown of the capacitance insulating film 118 is more likely to occur. However, when the antenna ratio is too small or too large, the breakdown of the capacitance insulating film does not occur, and there is no correlation between the antenna ratio and the breakdown of the capacitance insulating film. That is to say, it cannot be said that it is effective to adjust the antenna ratio to be a certain value or more in order to suppress or prevent the breakdown of the capacitance insulating film in the semiconductor that is a MOS capacitor.

SUMMARY OF THE INVENTION

Noting that the breakdown of the capacitance insulating film is caused by the concentration of an electric field in the boundary portion that is in contact with the isolating region, it is an object of the present invention to provide a semiconductor device that is MIS capacitor in which the breakdown of the capacitance insulating film is suppressed or prevented more reliably, and a method for producing the same.

A semiconductor device of the present invention includes a semiconductor substrate including an active region and an isolating region provided so as to enclose the active region; a capacitance insulating film that is provided on the active region and in contact with the isolating region; an upper electrode provided on the capacitance insulating film so as to be spaced away from the isolating region; an electrode pad provided on the isolating region; a lead conductive film provided over apart of the capacitance insulating film and a part of the isolating region for connecting the upper electrode and the electrode pad, and an interlayer insulating film provided over the substrate, wherein contact holes penetrating the interlayer insulating film to reach the electrode pad are formed, and the ratio of the total sum of the exposed areas of the electrode pad in the contact holes with respect to the total sum of the widths of the lead conductive films on the boundary line between the active region and the isolating region is a certain value or less.

It is confirmed empirically that in the semiconductor device having this configuration, the breakdown of the capacitance insulating film can be suppressed or prevented when forming the contact holes penetrating the interlayer insulating film to reach the electrode pad by plasma etching.

A semiconductor device of the present invention includes a semiconductor substrate including an active region and an isolating region formed so as to enclose the active region; a capacitance insulating film that is formed on the active region and has a boundary portion in contact with the isolating region; an upper electrode provided on the capacitance insulating film so as to be spaced away from the isolating region; an electrode pad formed on the isolating region; a lead conductive film provided over a part of the capacitance insulating film and a part of the isolating region for connecting the upper electrode and the electrode pad; and an interlayer insulating film provided over the substrate, wherein contact holes penetrating the interlayer insulating film to reach the electrode pad are formed, and the capacitance insulating film has a larger thickness in the boundary portion than in other portions.

This embodiment can increase the breakdown voltage of the boundary portion of the capacitance insulating film that are in contact with the isolating region, and the breakdown of the capacitance insulating film can be suppress or prevented when forming the contact holes penetrating the interlayer insulating film to reach the electrode pad by plasma etching.

A semiconductor device of the present invention includes a semiconductor substrate including a first active region, an isolating region formed so as to enclose the first active region, and a second active region provided such that the isolating region is sandwiched by the second active region and the first active region; a first capacitance insulating film that is provided on the first active region and has a boundary portion in contact with the isolating region; a second capacitance insulating film formed on the second active region; an upper electrode provided on the first capacitance insulating film so as to be spaced away from the isolating region; an electrode pad formed on the isolating region; a lead conductive film provided over a part of the first capacitance insulating film and a part of the isolating region for connecting the upper electrode and the electrode pad; and an interlayer insulating film provided over the substrate, wherein first contact holes penetrating the interlayer insulating film to reach the electrode pad and second contact holes penetrating the interlayer insulating film and the second capacitance insulating film to reach the second active region are provided.

According to this embodiment, the electrode pad, the lead conductive film and the upper electrode are positively charged by plasma etching when forming the first contact holes, and the semiconductor substrate opposed thereto via the capacitance insulating film serves as the counter electrode. At the same time, the semiconductor substrate is also positively charged by plasma etching when forming the second contact holes, as well as the electrode pad, the lead conductive film and the upper electrode. As a result, the difference in the electric potential between the electrode pad, the lead conductive film and the upper electrode and the semiconductor substrate becomes small. When the difference in the electric potential between the lead conductive film and the silicon substrate is small, the electric field in the boundary portion of the capacitance insulating film that is in contact with the isolating region below the lead conductive film becomes small, so that the breakdown can be suppressed or prevented. In other words, a semiconductor device can be obtained in which the breakdown of the capacitance insulating film can be suppressed or prevented when forming the contact holes penetrating the interlayer film to reach the electrode pad by plasma etching.

It is preferable that the diameter of the second contact hole is larger than that of the first contact hole.

The thickness of the interlayer insulating film on the electrode pad is smaller than that of the interlayer insulating film on the second active region, and therefore when the first and the second contact holes have the same diameter, the charge amount in the second active region, that is, the charge amount in the semiconductor substrate, becomes larger. However, when the diameter of the second contact hole is larger than that of the first contact hole, electrons go into the second contact holes so that electrical neutralization is facilitated. Thus, the difference in the electric potential between the lead conductive film and the semiconductor substrate can be small, so that the electric field in the boundary portion can be relaxed.

It is preferable that the aspect ratio of the first contact hole is equal to that of the second contact hole.

This embodiment makes it possible that the charge amount in the electrode pad in the first contact holes is equal to the charge amount in the second active region in the second contact holes, so that the difference in the electric potential between the lead conductive film and the semiconductor substrate can be substantially zero.

A method for producing a semiconductor device of the present invention includes step (a) of preparing a semiconductor substrate including an active region in its upper portion; step (b) of forming an isolating region in an upper portion of the semiconductor substrate so as to enclose the active region; step (c) of forming a capacitance insulating film having a boundary portion in contact with the isolating region on the active region; step (d) of forming an upper electrode provided on the capacitance insulating film so as to be spaced away from the isolating region, an electrode pad formed on the isolating region, and a lead conductive film over a part of the capacitance insulating film and a part of the isolating region for connecting the upper electrode and the electrode pad; step (e) of forming an interlayer insulating film over the substrate; and step (f) of forming contact holes penetrating the interlayer insulating film to reach the electrode pad by plasma etching such that the ratio of the total sum of exposed areas of the electrode pad in the contact holes with respect to the total sum of the widths of the lead conductive films in the boundary portion is a certain value or less.

It is confirmed empirically that this embodiment provides a semiconductor device in which the breakdown of the capacitance insulating film is suppressed or prevented when forming the contact holes penetrating the interlayer insulating film to reach the electrode pad by plasma etching.

In the step (f), the contact holes may be formed such that the ratio is a certain value or less by adjusting either one of the number of the contact holes, the exposed areas of the electrode pad in the contact holes, and the total sum of the widths of the lead conductive films in the boundary portion.

In the step (f), the contact holes may be formed by adjusting the aspect ratio of the contact hole while satisfying the conditions that allow the ratio to be a certain value or less.

As described above, conventionally, when the contact holes having a high aspect ratio are formed, the breakdown of the capacitance insulating film is likely to occur. However, according to the method for producing a semiconductor device of the present invention, the breakdown of the capacitance insulating film can be suppressed or prevented. Therefore, it is possible to form contact holes having a high aspect ratio. In other words, also when multiple contact holes having a high aspect ratio are required to be formed, it is easy to suppress or prevent breakdown of the capacitance insulating film from occurring while maintaining the high aspect ratio simply by adjusting the diameter and the number of the contact holes to satisfy the conditions that allow the ratio to be a certain value or less. Therefore, an MIS capacitor in which the necessary number of contact holes are provided in a limited area can be obtained.

A method for producing a semiconductor device of the present invention includes step (a) of preparing a semiconductor substrate including an active region; step (b) of forming an isolating region in an upper portion of the semiconductor substrate; step (c) of introducing impurities having an oxidation enhanced diffusion effect in a portion of the active region adjacent bordering the isolating region; step (d) of forming a capacitance insulating film having a boundary portion in contact with the isolating region by oxidizing an upper portion of the active region; step (e) of forming an upper electrode provided on the capacitance insulating film so as to be spaced away from the isolating region, an electrode pad formed on the isolating region, and a lead conductive film over a part of the capacitance insulating film and a part of the isolating region for connecting the upper electrode and the electrode pads; step (f) of forming an interlayer insulating film over the substrate; and step (g) of forming contact holes penetrating the interlayer insulating film to reach the electrode pad by plasma etching.

According to this embodiment, a region containing high-concentration impurities having an oxidation enhanced diffusion effect is formed in the portion of the active region bordering the isolating region. The oxidation speed of silicon is high on the region containing high-concentration impurities having an oxidation enhanced diffusion effect. Therefore, when forming the capacitance insulating film on the active region, the thickness of the boundary portion of the capacitance insulating film that is in contact with the isolating region becomes large. Thus, the breakdown voltage of the boundary portion of the capacitance insulating film that is in contact with the isolating region can be increased, and the breakdown of the capacitance insulating film is suppressed or prevented when forming the contact holes penetrating the interlayer insulating film to reach the electrode pad by plasma etching.

A method for producing a semiconductor device of the present invention includes step (a) of preparing a semiconductor substrate including an active region; step (b) of forming an isolating region in an upper portion of the semiconductor substrate to separate the active region into a first active region and a second active region; step (c) of forming a first capacitance insulating film having a boundary portion in contact with the isolating region on the first active region and forming a second capacitance insulating film on the second active region; step (d) of forming an upper electrode provided on the first capacitance insulating film so as to be spaced away from the isolating region, an electrode pad formed on the isolating region, and a lead conductive film provided over a part of the first capacitance insulating film and a part of the isolating region for connecting the upper electrode and the electrode pad; step (e) of forming an interlayer insulating film over the substrate; and step (f) of forming first contact holes penetrating the interlayer insulating film to reach the electrode pad and second contact holes penetrating the interlayer insulating film and the second capacitance insulating film to reach the second active region by plasma etching.

According to this embodiment, the electrode pad, the lead conductive film and the upper electrode are positively charged by plasma etching when forming the first contact holes, and the semiconductor substrate opposed thereto via the capacitance insulating film serves as the counter electrode. At the same time, the semiconductor substrate is also positively charged by plasma etching when forming the second contact holes, as well as the electrodes pad, the lead conductive film and the upper electrode. As a result, the difference in the electric potential between the electrode pad, the lead conductive film and the upper electrode and the semiconductor substrate becomes small. When the difference in the electric potential between the lead conductive film and the silicon substrate is small, the electric field in the boundary portion of the capacitance insulating film that is in contact with the isolating region below the lead conductive film becomes small, so that the breakdown can be suppressed and prevented.

It is preferable that in the step (f), the contact holes are formed such that the diameter of the second contact hole is larger than that of the first contact hole.

The thickness of the interlayer insulating film on the electrode pad is smaller than that of the interlayer insulating film on the second active region, and therefore when the first and the second contact holes have the same diameter, the charge amount in the second active region, that is, the charge amount in the semiconductor substrate, becomes larger. However, when the diameter of the second contact hole is larger than that of the first contact hole, electrons go into the second contact holes so that electrical neutralization is facilitated. Thus, the difference in the electric potential between the lead conductive film and the semiconductor substrate can be small.

It is preferable that the contact holes are formed such that the aspect ratio of the first contact hole is equal to that of the second contact hole.

This embodiment makes it possible that the charge amount in the electrode pad in the first contact holes is equal to the charge amount in the second active region in the second contact holes, so that the difference in the electric potential between the lead conductive film and the semiconductor substrate can be substantially zero.

DETAILED DESCRIPTION OF THE INVENTION

Figure 8:
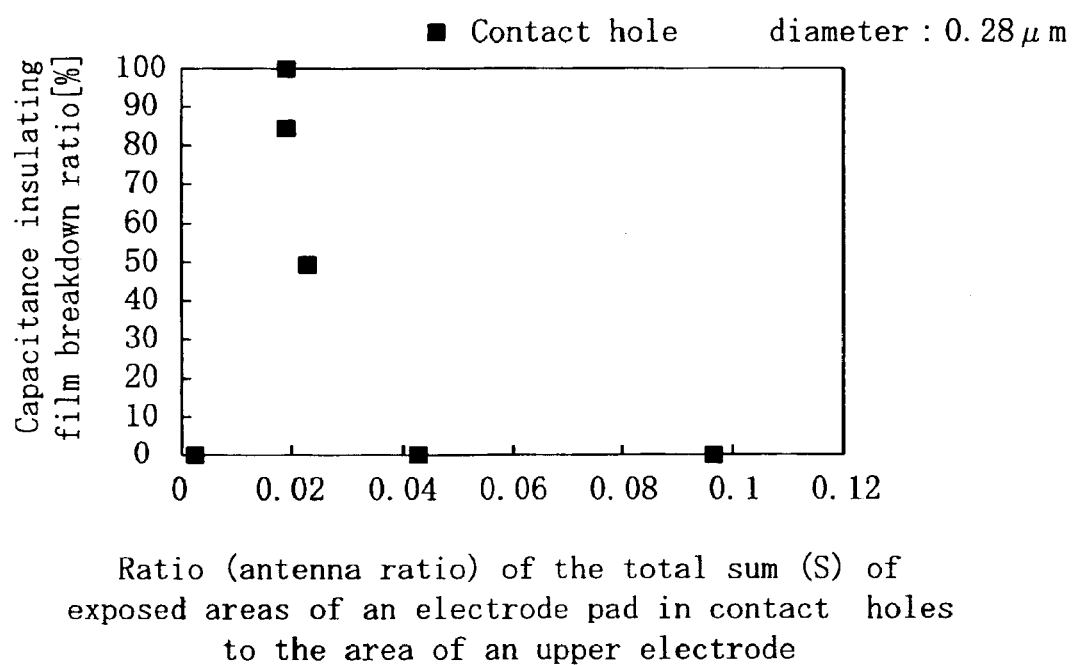
FIG. 8 is a graph showing the relationship between the upper electrode area and the total sum of the exposed areas of electrode pad in the contact holes and the breakdown ratio of the capacitance insulating film of a MOS capacitor.

As described above, adjusting the antenna ratio fails to reliably suppress or prevent the breakdown of the capacitance insulating film in a MOS capacitor. Therefore, noting that in the conventional semiconductor device, breakdown is likely to occur in the boundary portion that is in contact with the isolating region of the capacitance insulating film below the lead conductive film, the data shown in FIG. 8 were reviewed. Table 1 shows the conditions under which measurements were performed, and FIG. 1 shows the results.

TABLE 1

| L ($\mu$m) | The diameter of contact holes ($\mu$m) | The number of contact holes | S ($\mu m^2$) | (S/L) |
|---|---|---|---|---|
| 8 | 0.28 | 1280 | 78.8 | 9.9 |
| 8 | 0.28 | 1108 | 68.2 | 8.5 |
| 8 | 0.28 | 906 | 55.8 | 7.0 |
| 8 | 0.28 | 522 | 32.1 | 4.0 |
| 8 | 0.28 | 260 | 16.0 | 2.0 |
| 8 | 0.28 | 158 | 9.7 | 1.2 |

Figure 1:
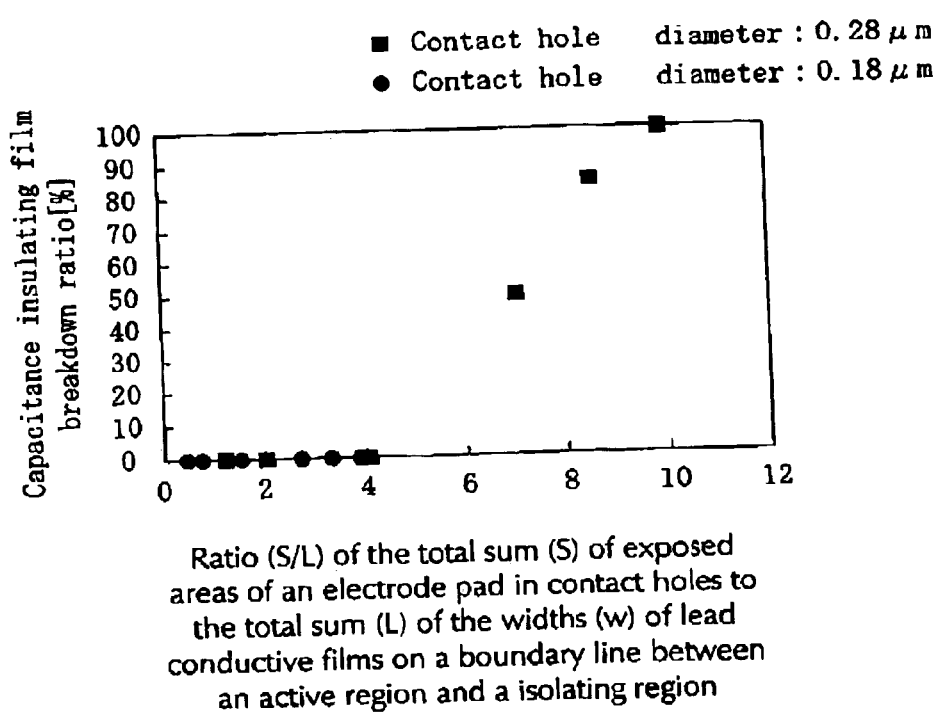
FIG. 1 is a graph showing the relationship between the ratio (S/L) of the total sum (S) of the exposed areas of an electrode pad in contact holes to the total sum (L) of the widths (w) of lead conductive films on a boundary line between an active region and an isolating region and the breakdown ratio of the capacitance insulating film.

FIG. 1 is a graph plotted with the breakdown ratio of the capacitance insulting film 118 with respect to the ratio (S/L) of the total sum (S) of the exposed areas of the electrode pad 124 in contact holes 128 to the total sum (L) of the widths (w) of the lead conductive films 122 on the boundary line between the active region 116 and the isolating region 114. Herein, increasing or decreasing the S/L was performed by setting L as a constant (8 $\mu$m) and increasing or decreasing S. Increasing or decreasing S was performed in the following two ways: The diameter of the contact hole 128 is set to be a conventional value (0.28 $\mu$m) and the number of the contact holes 128 is increased or decreased; and the diameter of the contact hole 128 is set to be smaller (0.18 $\mu$m) than the conventional value and the number of the contact holes 128 is increased or decreased. The measurement conductions shown in Table 1 are those in the ease where the diameter of the contact hole 128 is set to be a conventional value (0.28 $\mu$m) and the number of the contact holes 128 is increased or decreased. The results indicate that when the value of S/L is 4 or less, the breakdown ratio of the capacitance insulating film 118 is substantially zero, as shown in FIG. 1. Embodiments 1 to 3 below were performed based on these results.

Hereinafter, embodiments of the present invention will be described with reference to the accompanying drawings. For simplification, elements common to the embodiments bear the same reference numerals.

Embodiment 1

Figure 2A:
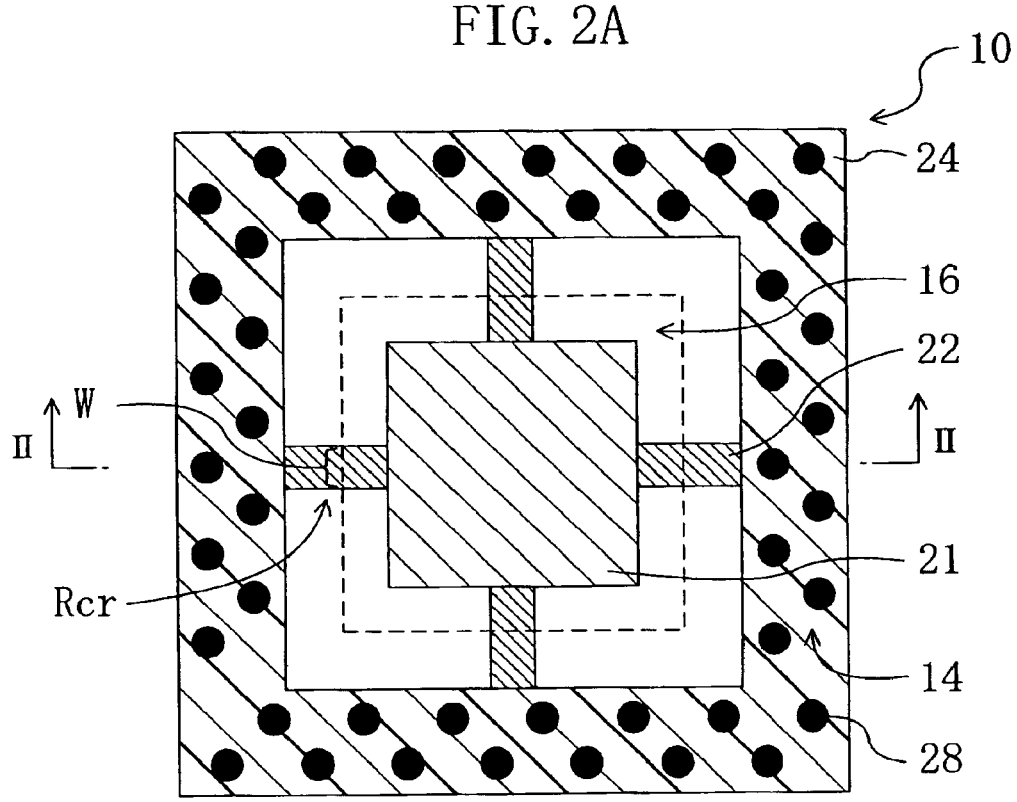
FIG. 2(a) is a schematic top view showing a semiconductor device 10 of an embodiment of the present invention.
Figure 2B:
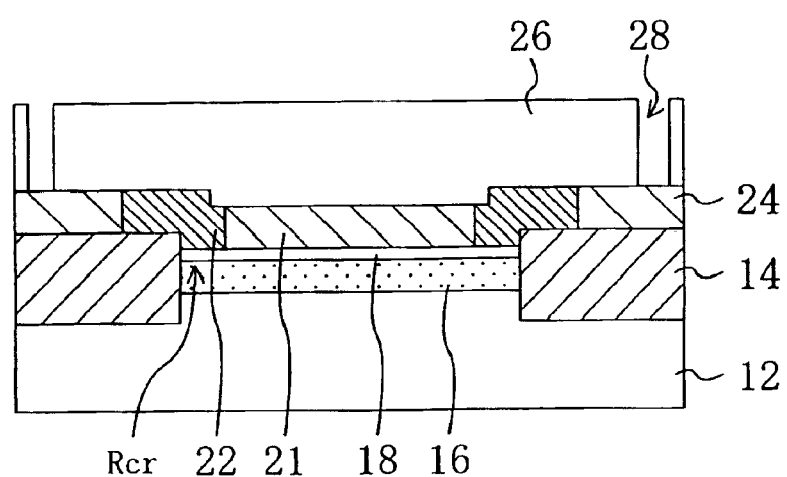
FIG. 2(b) is a cross-sectional view taken along line II—II shown in FIG. 2(a).

FIG. 2(a) is a schematic top view showing a semiconductor device 10 that is a MOS capacitor of this embodiment, and FIG. 2(b) is a cross-sectional view taken along line II—II shown in FIG. 2(a).

As shown in FIGS. 2(a) and 2(b), in the semiconductor device 10 of this embodiment, an active region 16 is formed on a silicon substrate 12, and an isolating region 14 is formed so as to enclose the active region 16. A capacitance insulating film 18 is formed on the active region 16. A rectangular upper electrode 21 is formed so as to be spaced away from the isolating region 14. A rectangular ring electrode pad 24 is provided on the isolating region 14 so as to enclose the active region 16. Each side of the electrode pad 24 and each side of the upper electrode 21 are connected to each other via a lead conductive film 22. Furthermore, an interlayer insulating film 26 is formed above the substrate, and contact holes 28 penetrating the interlayer insulating film 26 to reach the electrode pad 24 are formed.

In the semiconductor device 10 of this embodiment, based on the results of FIG. 1, the value of S/L is adjusted to 4 or less by reducing the number of the contact holes 28 (a diameter of 0.28 $\mu$). Thus, the ratio (S/L) of the total sum (S) of the exposed areas of the electrode pad 24 in the contain holes 28 with respect to the total sum (which is equal to the total sum of the widths of the lead conductive films 22 in this embodiment: L) of the widths (w) of the lead conductive films 22 on the boundary line between the active region and the isolating region 14 is reduced. As a result, the breakdown ratio of the capacitance insulating film 18 can be substantially zero by adjusting the value of S/L to 4 or less, as shown in FIG. 1.

Next, a method for producing the semiconductor device 10 will be described.

First, a silicon substrate 12 is prepared, and an upper portion of the silicon substrate 12 is etched to form a shallow groove, and then an isolating region 14 is formed by performing a STI (Shallow Trench Isolation) method to bury an oxide film. Alternatively, a conventional LOCOS method can be used.

Next, a capacitance insulating layer 18 is formed by oxidizing an upper portion of the active region 16 where the isolating region 14 in an upper portion of the silicon substrate 12 is not formed. The capacitance insulating layer 18 can be formed by CVD.

Next, a polysilicon film is deposited on the substrate, and then the polysilicon film is patterned by lithography and dry-etching so that an upper electrode 21, a lead conductive film 22, and an electrode pad 24 are formed integrally. In this embodiment, the upper electrode 21, the lead conductive film 22, and the electrode pad 24 are formed with the polysilicon film, but a conductive metal material film can be used.

Next, an interlayer insulating film 26 is formed by depositing a silicon oxynitride film.

Next, photolithography and plasma etching are performed to form a contact hole 28 reaching the electrode pad 24 in the interlayer insulating film 26. The contact hole 28 is formed by plasma etching such that the value of S/L is 4 or less.

In this embodiment, the capacitance insulating film 18 formed of a silicon oxynitride film was used, but the capacitance insulating film 18 can be formed of a silicon oxide film, a silicon nitride film or other high dielectric constant films. However, the capacitor insulating films 18 formed of these material shave a different breakdown voltage from that of a silicon oxide film, so that the value of S/L that allows the breakdown ratio of the capacitance insulating film 18 to be substantially zero can be varied depending on the material of the capacitance insulating film 18. However, the value of S/L is still important, regardless of the material used. Therefore, the value of S/L that allows the breakdown ratio to be substantially zero or small enough so that there is no practical problem is determined, and based on the results, the widths (w) of the lead conductive films 22 on the boundary line between the active region 16 and the isolating region 14 and the diameter and the number of the contact holes 28 can be adjusted.

Embodiment 2

Figure 3A:
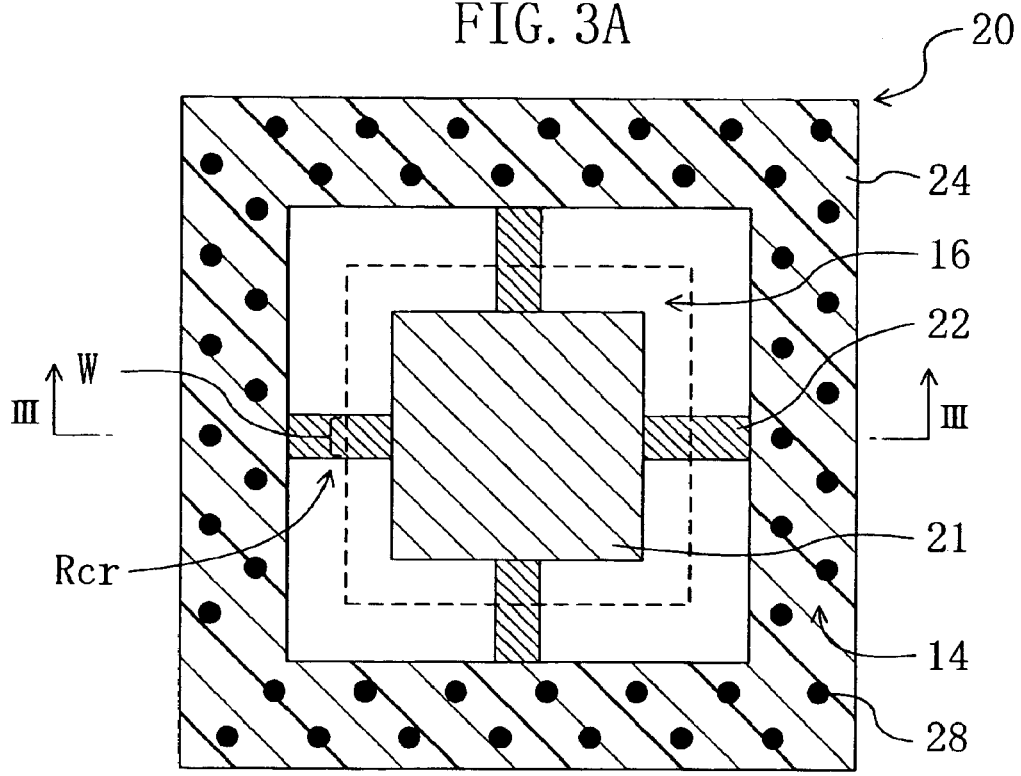
FIG. 3(a) is a schematic top view showing a semiconductor device 20 of an embodiment of the present invention.
Figure 3B:
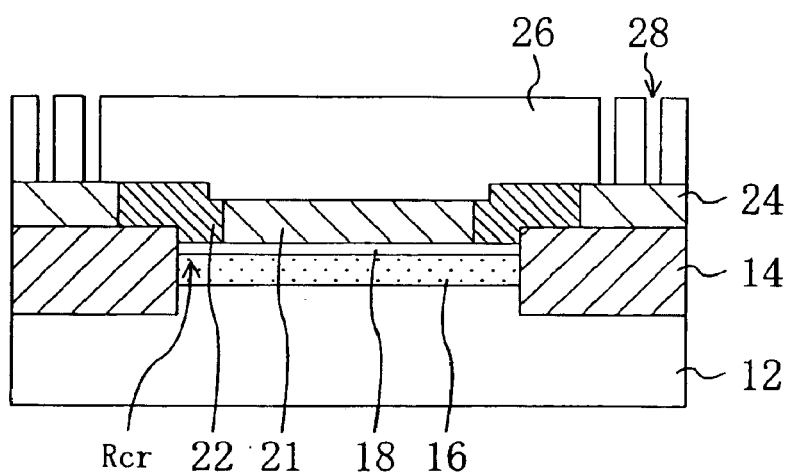
FIG. 3(b) is a cross-sectional view taken along line III—III shown in FIG. 3(a).

FIG. 3(a) is a schematic top view showing a semiconductor device 20 that is a MOS capacitor of this embodiment, and FIG. 3(b) is a cross-sectional view taken along line III—III shown in FIG. 3(a).

As shown in FIGS. 3(a) and 3(b), a semiconductor device 20 of this embodiment has the same configuration as that of the semiconductor device 10 of Embodiment 1, except that the diameter of the contact hole 28 formed on the substrate is smaller (0.18 $\mu$m) than that of the conventional semiconductor device, and that the number of the contact holes 28 is the same as that of the conventional semiconductor device.

In this embodiment, based on the results of FIG. 1, the diameter of the contact hole 28 is smaller than that of the conventional semiconductor device. Thus, in the semiconductor device 20 of this embodiment, the ratio (S/L) of the total sum (S) of the exposed areas of the electrode pad 24 in the contact hole 28 with respect to the total sum (L) of the widths (w) of the lead conductive films 22 on the boundary line between the active region 16 and the isolating region 14 is sot to 4 or less. As a result, the breakdown ratio of the capacitance insulating film 18 can be substantially zero, as shown in FIG. 1.

A method for producing the semiconductor device 20 of this embodiment is the same as that of Embodiment 1. However, it is necessary to form the contact hole 28 having a smaller diameter than that of the conventional device, and in the process of photolithography, the diameter of the contact hole 28 is reduced by reducing the diameter of a portion corresponding to the contact hole 28 of a photomask.

In this embodiment, the diameter of the contact hole 28 is smaller than that of the conventional device. However, in order to decrease the value of S/L, it is sufficient that the total sum of the exposed areas of the electrode pad 24 in the contact holes 28 is reduced. Therefore, for example, the contact hole 28 can be formed so as to have a decreasing diameter as approaching the electrode pad by etching. In this method, the following etching conditions are used. Gases such as $C_4F_8$, $C_5F_8$, $C_4F_6$, and $C_2F_4$ are used, and $CH_2F_2$, CO, $O_2$, Ar, $CO_2$ or the like are used as an additional gas. Under such conditions, polymer is formed on the side walls of the contact holes during etching, and the thickness of the polymer is large, so that the contact holes can be formed so as to have a decreasing diameter as approaching the electrode pad.

Furthermore, in this embodiment, the capacitance insulating film 18 formed of a silicon oxynitride film was used, as in Embodiment 1. However, the capacitance insulating film 18 can be formed of a silicon oxide film a silicon nitride film or other high dielectric constant films. Furthermore, the value of S/L that allows the breakdown ratio of the capacitance insulating film 18 to be substantially zero can be varied depending on the material of the capacitance insulating film 18. However, the value of S/L is still important, regardless of the material used. Therefore, the value of S/L that allows the breakdown ratio to be substantially zero or small enough so that there is no practical problem is determined, and based on the results, the widths (w) of the lead conductive films 22 on the boundary line between the active region 16 and the isolating region 14 and the diameter and the number of the contact holes 28, can be adjusted.

As described above, the holes are formed so as to have S/L of a certain value or less by adjusting the number of the contact holes in Embodiment 1 and adjusting the area in which the electrode pad is exposed in the contact holes in Embodiment 2. In other words, the value of S/L is set to a certain value or less by reducing S. However, the value of S/L can be set to a certain value or less by increasing L (total sum of the widths of the lead conductive films in the boundary portion).

Furthermore, as seen from Embodiments 1 and 2, the breakdown of the capacitance insulating film can be prevented by satisfying the conditions that allow the value of S/L to be a certain value or less. Therefore, when multiple contact holes having a high aspect ratio are required to be formed, the breakdown of the capacitance insulating film easily can be suppressed or prevented simply by adjusting the diameter and the number of the contact holes to satisfy the conditions that allow the value of S/L to be a certain value or less. Thus, satisfying the conditions that allow the value of S/L to be a certain value or less is effective to achieve miniaturization of the contact holes in MIS capacitors.

In Embodiments 1 and 2, the total sum (L) of the widths (w) of the lead conductive films 22 on the boundary line between the active region 16 and the isolating region 14 is 8 $\mu$m, and it is preferable that L is 8 $\mu$m or more because the electric field in the boundary portion Rcr can be relaxed. The number of the contact holes 28 is 158 in Embodiment 1 and 260 in Embodiment 2, and it is preferable that the number of the contact holes 28 is not more than 522. The exposed area of the electrode pad 24 in the contact holes 28 is 9.7 $\mu m^2$ in Embodiment 1 and 16 $\mu m^2$ in Embodiment 2, and it is preferable that the exposed area is not more than 32 $\mu m^2$ because the amount of charges accumulated in the electrode pad can be reduced.

Embodiment 3

Figure 4:
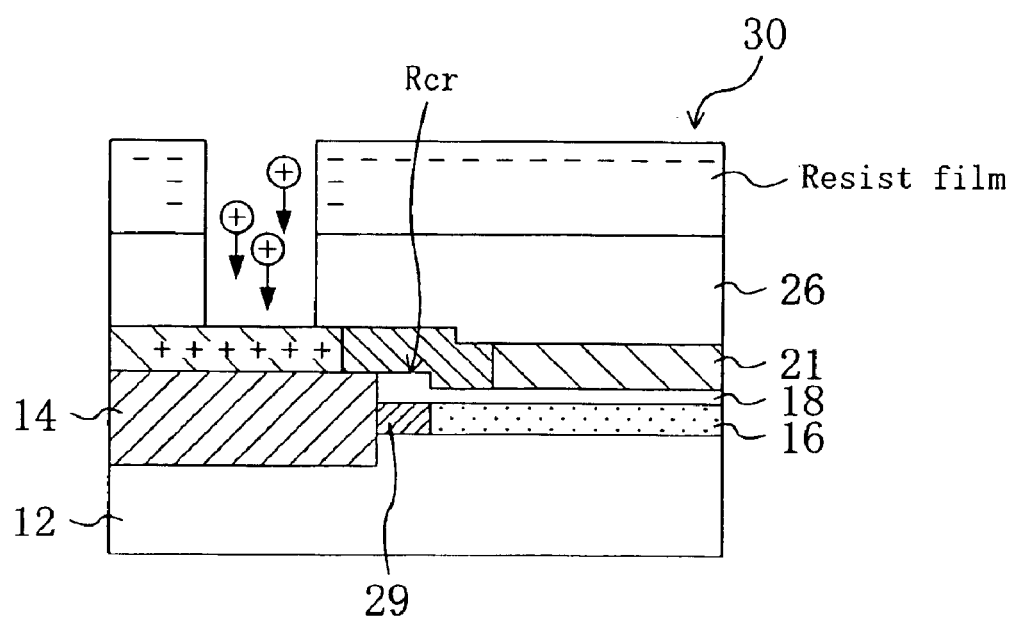
FIG. 4 is a schematic cross-sectional view showing a semiconductor device 30 of an embodiment of the present invention.

FIG. 4 is a schematic cross-sectional view showing a semiconductor device 30 that is a MOS capacitor of this embodiment.

The semiconductor device 30 of this embodiment has the same configuration as that of the semiconductor device 10 of Embodiment 1, except that the cross-section taken along line II—II shown in FIG. 2(a) is replaced by the configuration shown in FIG. 4, and that the thickness of the boundary portion Rcr of the capacitance insulating film 18 that is in contact with the isolating region 14 below the lead conductive film 22 is increased. Noting that the breakdown of the capacitance insulating film is caused by concentration of an electric field in the boundary portion that is in contact with the isolating region in the conventional semiconductor device, a larger thickness is formed to increase the breakdown voltage in the boundary portion Rcr of the capacitance insulating film 18 that is in contact with the isolating region 14.

A method for producing the semiconductor device 30 of this embodiment is the same as that of Embodiment 1, except that high-concentration boron is introduced in the boundary portion in the active region 16 that is in contact with the isolating region 14 at a dose amount of $1 \times 10^{20}$ atoms·cm$^{-2}$ by ion implantation to form a high-concentration boron region 29 after the process of forming the isolating region 14. The total sum of the exposed areas of the electrode pad 24 in the contact holes 28 can be the same as in the conventional devices.

The oxidation speed of silicon is increased on a region containing boron having an oxidation enhanced diffusion effect such as the high-concentration boron region 29. Therefore, when forming the capacitance insulating film 18 on the active region 16, the thickness of the boundary portion Rcr of the capacitance insulating film 18 that is in contact with the isolating region 14 is large. In order words, the capacitance insulating film 18 having portions with different thicknesses can be formed in one process. Thus, the breakdown voltage of the boundary portion Rcr of the capacitance insulating film 18 that is in contact with the isolating region 14 can be increased. For example, in the case of this embodiment, the thickness of the capacitance insulating film 18 on the active region is 4 nm, whereas the thickness of the boundary portion Rcr of the capacitance insulating film 18 that is in contact with the isolating region 14 is 8 nm. For this reason, the breakdown voltage of the boundary portion Rcr of the capacitance insulating film 18 that is in contact with the isolating region 14 is about twice the breakdown voltage of the capacitance insulating film 18 on the active region 16, and the breakdown of the capacitance insulating film 18 did not occur until the value of S/L reached about 8. This indicates that according to this embodiment, the ratio of the total sum (S) of the exposed areas of the electrode pad 24 in the contact holes 28 with respect to the total sum (L) of the widths (w) of the lead conductive films 22 on the boundary line between the active region 16 and the isolating region 14 can be increase.

Embodiment 4

Figure 5A:
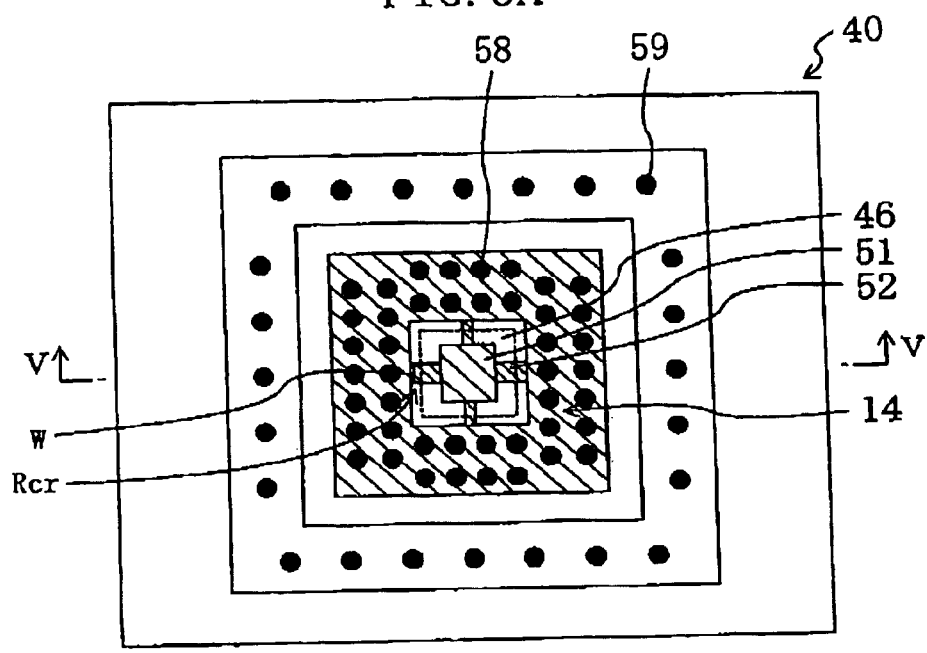
FIG. 5(a) is a schematic top view showing a semiconductor device 40 that is a MOS capacitor of an embodiment of the present invention.
Figure 5B:
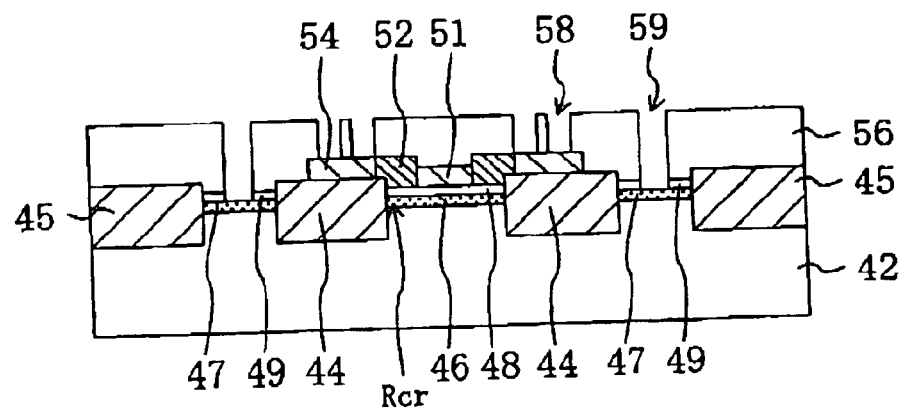
FIG. 5(b) is a cross-sectional view taken along line V—V shown in FIG. 5(a).
Figure 6A:
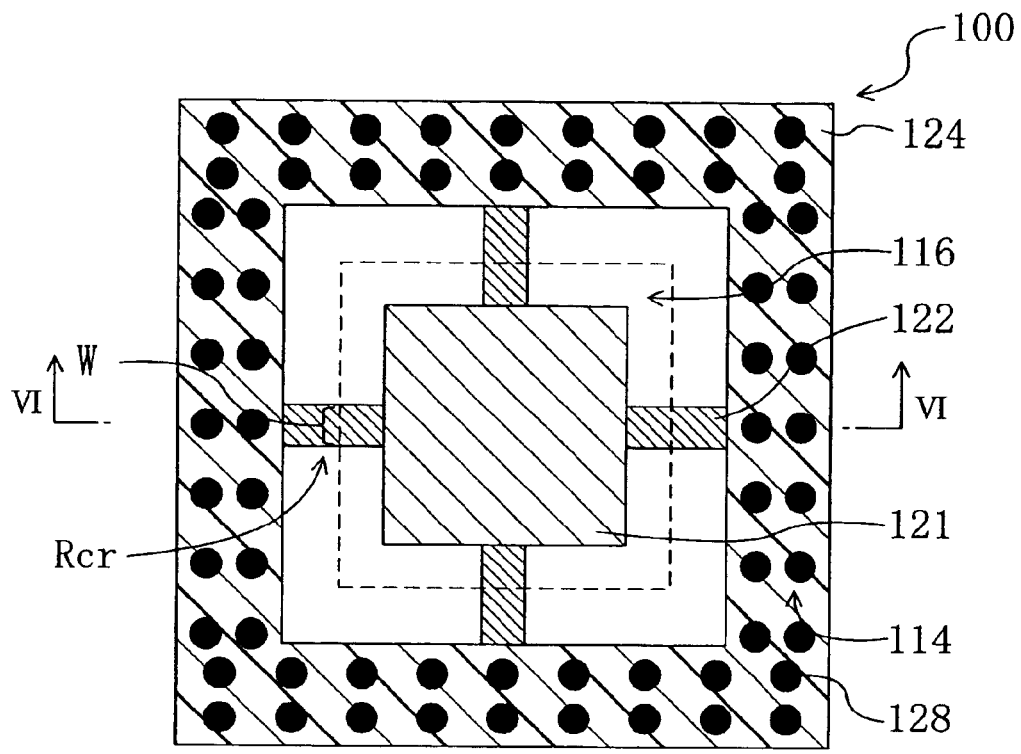
FIG. 6(a) is a schematic top view showing a conventional semiconductor device 100.
Figure 6B:
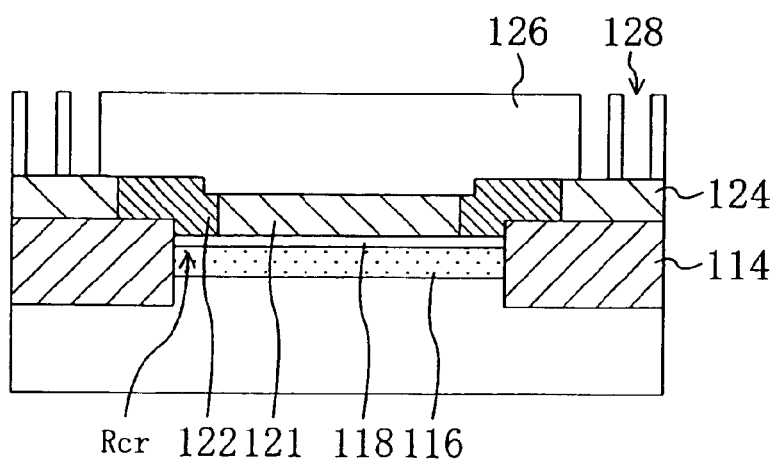
FIG. 6(b) is a cross-sectional view taken along line VI—VI shown in FIG. 6(a).
Figure 7A:
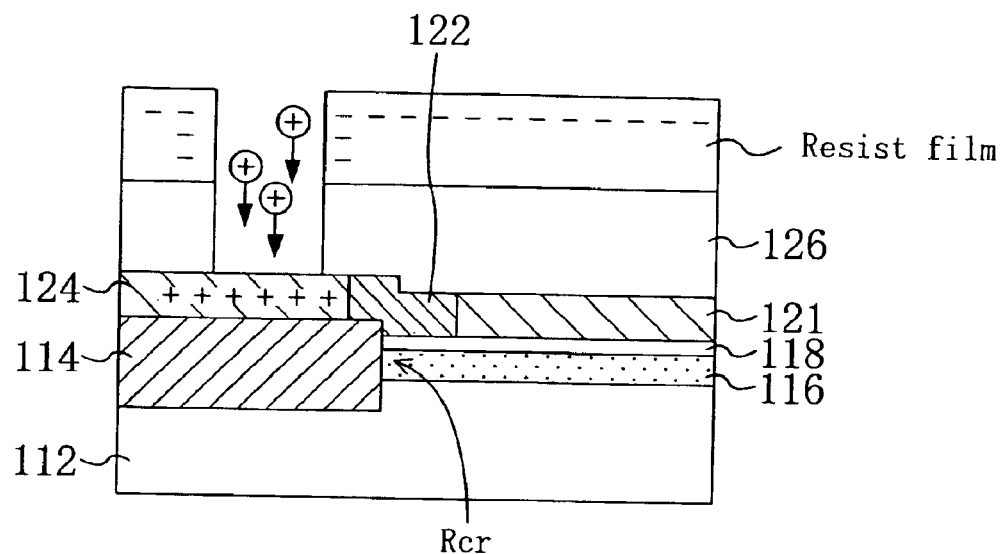
FIG. 7 are views showing the mechanism that causes breakdown of a capacitance insulating film.
Figure 7B:
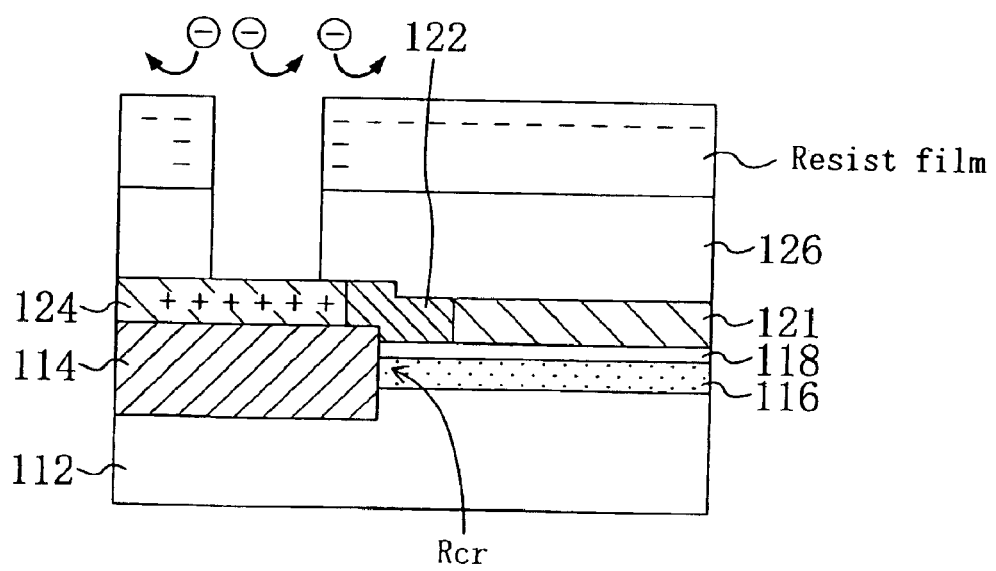

FIG. 5(a) is a schematic top view showing a semiconductor device 40 that is a MOS capacitor of this embodiment, and FIG. 5(b) is a cross-sectional view taken along line V—V shown in FIG. 5(a).

As shown in FIGS. 5(a) and 5(b), a semiconductor device 40 of this embodiment includes an isolating region 44 on a silicon substrate 42, and an active region 46 is formed in an upper portion on the silicon substrate 42 enclosed by the isolating region 44. Furthermore, an active region 47 is formed in an upper portion of the silicon substrate 42 outside the isolating region 44 so as to enclose the isolating region 44, and further an isolating region 45 is formed in an upper portion of the silicon substrate 42 outside thereof so as to enclose the active region 47. A capacitance insulating film 48 is formed on the active region 46, and a capacitance insulating film 49 is formed on the active region 47. On the capacitance insulating film 48, an upper electrode 51 is formed so as to be spaced away the isolating region 44. A rectangular ring electrode pad 54 is provided on the isolating region 44 so as to enclose the active region 46. Each side of the electrode pad 44 and each side of the upper electrode 51 are connected to each other via a lead conductive film 52. An interlayer insulating film 56 is formed above the substrate, and contact holes 58 penetrating the interlayer insulating film 56 to reach the electrode pad 54 and contact holes 59 penetrating the interlayer insulating film 56 and the capacitance insulating film 49 to reach the active region 47 are formed.

In this embodiment, the contact holes 58 penetrating the interlayer insulating film 56 to reach the electrode pad 54 and the contact holes 59 penetrating the interlayer insulating film 56 and the capacitance insulating film 49 to reach the active region 47 are simultaneously opened. At this time, the electrode pad 54, the lead conductive film 52, and the upper electrode 51 are positively charged by plasma etching for opening the contact holes 58, and the silicon substrate 42 that is opposed thereto via the capacitance insulating film 48 serves as the counter electrode. On the other hand, the silicon substrate 42 is also positively charged by plasma etching for opening the contact holes 59 in the same mechanism as for the electrode pad 54, the lead conductive film 52, and the upper electrode 51. As a result, the difference in the electric potential between the electrode pad 54, the lead conductive film 52 and the upper electrode 51, and the silicon substrate 42 becomes small. When the difference in the electric potential between the lead conductive film 52 and the silicon substrate 42 is small, the electric field in the boundary portion Rcr of the capacitance insulating film 48 that is in contact with the isolating region 44 below the lead conductive film 52 becomes small, so that the breakdown can be suppressed and prevented. In particular, it is most preferable that the difference in the electric potential between the lead conductive film 52 and the silicon substrate 42 is zero.

In order to make the difference in the electric potential between the lead conductive film 52 and the silicon substrate 42 zero, it is necessary to equalize the charge amount in the lead conductive film 52 with that of the silicon substrate 42. However, the thickness of the interlayer insulating film 56 on the electrode pad 54 is smaller than that of the interlayer insulating film 56 on the active region 47, and therefore when the contact holes 58 and 59 have the same diameter, the charge amount in the active region 47, that is, the charge amount in the silicon substrate 42, becomes larger. In order to prevent it, it is effective to increase the diameter of the contact hole 59 so that electrons go into the contact hole to facilitate electrical neutralization. Furthermore, it is preferable to equalize the aspect ratio of the contact holes 59 with that of the contact holes 58. Thus, the charge amount in the electrode pad 54 in the contact hole 58 is equal to the charge amount in the active region 47 in the contact hole 59, so that the difference in the electric potential between the lead conductive film and the semiconductor substrate can be substantially zero.

In this embodiment, the contact holes 58 and the contact holes 59 are formed substantially to a cylindrical shape, the diameter of the contact holes 58 is 0.28 μm, the thickness of the interlayer insulating film 56 on the electrode pad 54 is 0.6 μm, the aspect ratio is 2.14, and the thickness of the interlayer insulating film 56 on the active region 47 is 0.8 μm. Therefore, the diameter of the contact holes 59 is adjusted to 0.37 μm.

Furthermore, in order to prevent increase the charge amount in the silicon substrate 42, it is effective to reduce the area of the active region 47 that is exposed to positive ions by adjusting the number of the contact holes 59. For example, the total sum of the exposed areas of the active region 47 in the contact holes 59 can be adjusted so as to be 57% of the total sum of the exposed areas of the electrode pad 54 in the contact holes 58.

Next, a method for producing the semiconductor device 40 will be described.

First, a silicon substrate 42 is prepared, and an upper portion of the silicon substrate 42 is etched to form a shallow groove, and then isolating regions 44 and 45 are formed by performing a STI method to bury an oxide film. Alternatively, a conventional LOCOS method can be used.

Next, the upper portions of active regions 46 and 47 in which the isolating regions 44 and 45 on the silicon substrate 42 are not formed are subjected to thermal oxidation to form capacitance insulating films 48 and 49. Alternatively, the CVD method can be used.

Next, a polysilicon film is deposited so as to cover from the upper portion of the capacitance insulating film 48 to the upper portion of the isolating region 44, and then the polysilicon film is patterned by lithography and dry-etching so that an upper electrode 51, a lead conductive film 52, and an electrode pad 54 are formed integrally.

Next, an interlayer insulating film 56 is formed by depositing a silicon oxynitride film.

Next, photolithography and plasma etching are performed so that contact holes 28 reaching the electrode pad 24 and contact holes 59 penetrating the interlayer insulating film 56 and the capacitance insulating film 49 to reach the active region 47 are opened in the interlayer insulating film 56.

What is claimed is:

1. A semiconductor device comprising:
    a semiconductor substrate including an active region and an isolating region formed so as to enclose the active region;
    a capacitance insulating film that is formed on the active region and has a boundary portion in contact with the isolating region;
    an upper electrode provided on the capacitance insulating film so as to be spaced away from the isolating region;
    an electrode pad formed on the isolating region;
    a lead conductive film provided over a part of the capacitance insulating film and a part of the isolating region for connecting the upper electrode and the electrode pad; and
    an interlayer insulating film provided over the substrate,
    wherein contact holes penetrating the interlayer insulating film to reach the electrode pad are formed,
    the active region in contact with the boundary portion includes a region containing impurities having an oxidation enhanced diffusion effect, and
    the capacitance insulating film is formed by oxidizing the active region and has a larger thickness in the boundary portion than in other portions.

2. A semiconductor device comprising:
    a semiconductor substrate including a first active region an isolating region formed so as to enclose the first active region, and a second active region provided such that the isolating region is sandwiched by the second active region and the first active region;
    a first capacitance insulating film that is formed on the first active region and has a boundary portion in contact with the isolating region;
    a second capacitance insulating film formed on the second active region;
    an upper electrode provided on the first capacitance insulting film so as to be spaced away from the isolating region;
    an electrode pad formed on the isolating region;
    a lead conductive film provided over a part of the first capacitance insulating film and a part of the isolating region for connecting the upper electrode and the electrode pad; and
    an interlayer insulating film provided over the substrate,
    wherein first contact holes penetrating the interlayer insulating film to reach the electrode pad and second contact holes penetrating the interlayer insulating film and the second capacitance insulating film to reach the second active region are provided, and
    a total sum of exposed areas of the second active region in the second contact holes is smaller than a total sum of exposed areas of the electrode pad in the first contact holes.

3. The semiconductor device according to claim 2,
    wherein the quantity of the second contact holes is adjusted such that the total sum of exposed areas of the second active region in the second contact holes is smaller than the total sum of exposed areas of the electrode pad in the first contact holes.

* * * * *

UNITED STATES PATENT AND TRADEMARK OFFICE
CERTIFICATE OF CORRECTION

PATENT NO. : 6,881,998 B2
APPLICATION NO. : 09/960575
DATED : April 19, 2005
INVENTOR(S) : Shinichi Imai It is certified that error appears in the above-identified patent and that said Letters Patent is hereby corrected as shown below:

Claim 2, col. 14, lines 11-12,

"a first active region an isolating region formed" should read

"a first active region, an isolating region formed"

Signed and Sealed this
Third Day of January, 2012

David J. Kappos
*Director of the United States Patent and Trademark Office*